United States Patent [19]

Savovic et al.

[11] Patent Number: 5,427,537
[45] Date of Patent: Jun. 27, 1995

[54] DEVICE WITH EXTERNAL INTERFACE

[75] Inventors: Niko M. Savovic, Sunrise; Michael M. Austin, Pompano Beach; Raymond J. Kleinert, III; Christian Schneider, both of Ft. Lauderdale; Robert D. Kreisinger, Plantation, all of Fla.

[73] Assignee: Motorola, Inc., Schaumburg, Ill.

[21] Appl. No.: 369,857

[22] Filed: Jan. 6, 1995

Related U.S. Application Data

[63] Continuation of Ser. No. 116,648, Sep. 7, 1993, abandoned.

[51] Int. Cl.⁶ .............................................. H05K 1/18
[52] U.S. Cl. ..................................... 439/77; 439/500; 439/495; 439/67
[58] Field of Search ............... 439/67, 77, 500, 928, 439/99, 100, 159, 495

[56] References Cited

U.S. PATENT DOCUMENTS

| | | |
|---|---|---|
| 3,897,994 | 8/1975 | Errichiello . |
| 4,383,363 | 5/1983 | Hayakawa et al. ............. 439/77 X |
| 4,784,615 | 11/1988 | Teng-Hong . |
| 4,835,410 | 5/1989 | Bhagwat et al. ............. 439/500 X |
| 5,006,073 | 4/1991 | Mennona, Jr. . |
| 5,197,889 | 3/1993 | Rizzo et al. .................. 439/500 X |
| 5,244,411 | 9/1993 | Schinke et al. ............... 439/500 X |
| 5,259,786 | 11/1993 | Huang ........................ 439/500 OR |
| 5,295,839 | 3/1994 | Grange et al. ................ 439/67 OR |

*Primary Examiner*—Larry I. Schwartz
*Assistant Examiner*—Daniel Wittels
*Attorney, Agent, or Firm*—Andrew S. Fuller

[57] ABSTRACT

A device (100) having an external contact electrical connection (155) for providing an electrical interface to the device includes a housing member (222) having apertures (235, 335), and a flexible film substrate (270) having an electrically conductive pattern (275). Portions of the electrically conductive pattern defines contact areas (255, 355) for presenting the electrical interface of the device (100). These contact areas (255, 355) are rigidly positioned adjacent to the interior surface (324) of the housing (222) about the apertures (235, 335) such that the contact areas (255) are externally exposed through the aperture (235, 335).

9 Claims, 2 Drawing Sheets

DEVICE WITH EXTERNAL INTERFACE

This is a continuation application of U.S. Ser. No. 08/116,648 filed on Sep. 7, 1993, now abandoned.

TECHNICAL FIELD

This invention relates in general to electrical devices, and in particular, to external interfaces to electrical devices.

BACKGROUND

There are many applications in which an external electrical interface is required for an electrical device. An external electrical interface is generally required for the provision of power to the device and to provide communications between the device and other electrical devices. Numerous techniques are known in the art for electrically interfacing to a device. One such technique, common to batteries and portable electronic devices, is the use of an electrical contact accessible through the device housing.

Electrical contacts have been traditionally formed using discrete contact elements electrically coupled to circuitry within the device. For example, a portable two-way radio may include a radio portion and a battery portion. The battery portion typically includes discrete electrical contacts for electrically interfacing with a battery charger, in addition to contacts for electrically interfacing with the radio portion. For example, U.S. Pat. No. 5,006,073, issued to Mennona, Jr. on May 15, 1990, for a Snap Fit Contact Assembly, discloses a device in which discrete electrical contacts are soldered to a flexible film substrate and then positioned within a housing. Electrical connection is provided between the contact and electrical circuitry within the battery, thus completing the external interface. Alternatively, the discrete contacts may be affixed directly to a circuit carrying substrate used in the internal operations of the battery. The contact may be soldered to the substrate, or affixed to the substrate using rivets, and the like, and is made externally accessible through openings within the housing.

However installed, the use of discrete electrical contacts in the design of external electrical interfaces has several drawbacks in product manufacturing. For example, there is significant time and cost involved in the design and development of contacts for a given product. Moreover, tools to produce the contacts must be designed and developed, which adds to the overall cost of the product. Thus, product development cycle time and cost are adversely affected by the use of discrete electrical contacts.

There are also manufacturing issues related to the use of discrete contacts in a product. Specific manufacturing operations must be designed to position the contacts during product assembly, to establish the proper electrical connections between the contacts and circuitry within the product. These operations, which include contact alignment and contact soldering, may require expensive tooling and other equipment, or may be labor intensive, and can be a contributing source of defects in the product. Thus, there is a penalty in manufacturing efficiency for products using discrete contacts.

Additionally, the use of discrete electrical contacts adds weight to a product, increases material costs, increases the number of parts required in a product, and increases inventory as stocks of these contacts are needed to facilitate production. These and other problems become more acute as product designers focus on reductions in costs, size, and weight, in the design of battery packages and other applications.

There are several benefits inherent in the use of electrical contacts to achieve external interfacing between electrical devices. Some of the more obvious benefits include the simplicity and convenience of establishing the interface. However, the costs associated with the above-mentioned problems are undesirable. As such, an improved interface design is needed, which avoids the problems associated with discrete electrical contacts while retaining the benefits of this type of external electrical interfacing.

SUMMARY OF THE INVENTION

Briefly, in accordance with the invention, a device having an external contact electrical connection for providing an electrical interface to the device is disclosed. The device includes a housing member having an aperture extending from the its exterior surface to its interior surface, and a flexible film substrate having an electrically conductive pattern. A portion of the electrically conductive pattern defines a contact area for presenting the electrical interface of the device. This contact area is rigidly positioned adjacent to the interior surface of the housing about the aperture such that the contact area is externally exposed through the aperture, thereby allowing direct external access to the contact area.

DETAILED DESCRIPTION OF THE EMBODIMENTS

Figure 1:
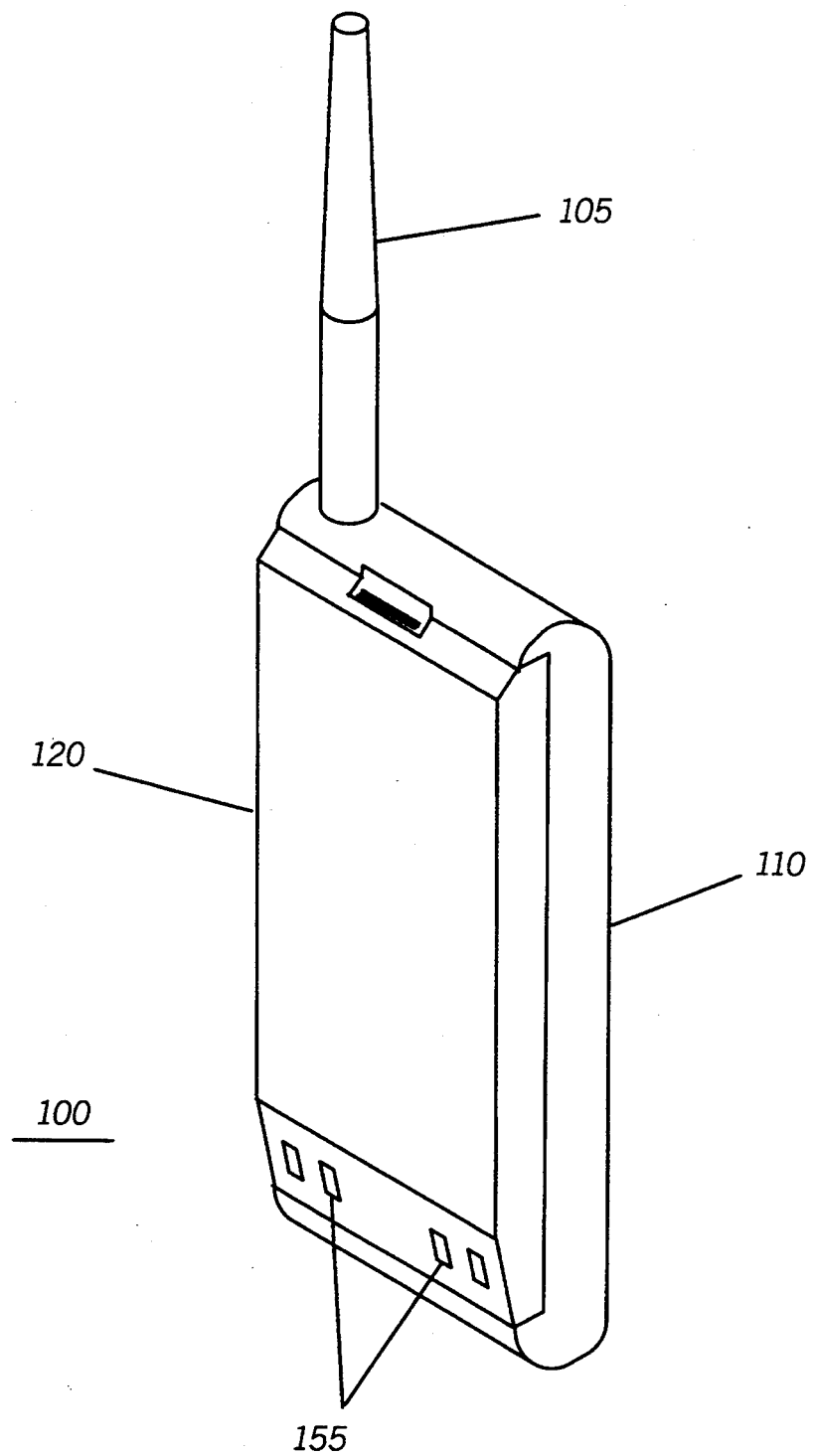
FIG. 1 shows the rear view of a portable two-way radio with battery attached, in accordance with the present invention.

Referring to FIG. 1, a portable two-way radio 100 is shown in accordance with the present invention. The radio 100 represents an electrical device in which an electrical interface to the device is provided through externally accessible electrical contacts within the body of the device. The radio 100 comprises a main radio portion 110, a battery portion 120, and an antenna 105. The radio portion 110 houses well known communications circuitry (not shown), for communicating over a radio frequency channel. The battery portion 120, though separable, is ordinarily attached to the radio portion 110 when the radio 100 is in use. The battery 120 is rechargeable through externally accessible electrical contacts 155 when inserted into a battery charger (not shown), thereby establishing an electrical interface between the battery charger (not shown) and the battery 120.

Figure 2:
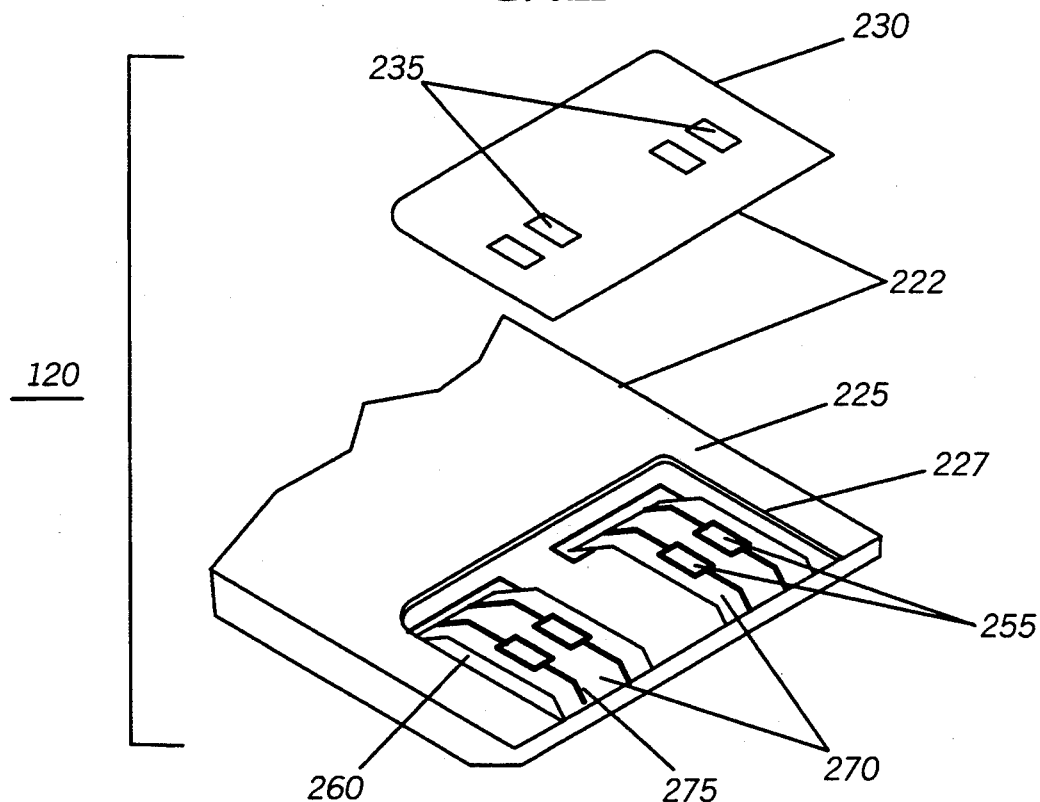
FIG. 2 shows an exploded perspective view of the battery of FIG. 1.

Referring to FIG. 2, an exploded perspective view of a portion of the battery 120 is shown. The battery 120 comprises a housing 222 having external access apertures 235, a flexible film substrate 270 having contact areas 255 disposed thereon for presenting the electrical interface of the battery 120, and a support member 260 to rigidly position the contact areas 255 with respect to the external access apertures 235. The housing 222 includes a main housing member 225 having a large aperture 227, and another housing member in the form of an escutcheon 230 having four smaller external access apertures 235. The large aperture 227 of the main housing member 225 is positioned over the flexible film substrate 270, and the escutcheon is mounted on the main housing member over the large aperture 227. The housing 222 encloses and protects the flexible film substrate 270, as well as other components of the battery 120.

The flexible film substrate 270 is a circuit carrying substrate having an electrically conductive pattern 275. The substrate 270 is made from insulating material, such as polyester or polyimide, or other material commonly used to manufacture flexible film substrates. The conductive pattern 275, which could be a single conductive strip, is ordinarily made from highly conductive metal, such as copper, and is embedded between layers of the insulating flexible film substrate material. The conductive pattern 275 is generally insulated but has some portions without insulation, which define the contact areas 255 for presenting the electrical interface of the battery 120. Thus, each contact area 255 is an exposed portion without insulation of the conductive or metallized pattern, which is electrically interconnected with other portions of the conductive pattern 275 on the substrate 270. Preferably, the contact areas 255 are plated with nickel, gold, or other conductive material, to enhance electrical conductivity, and to provide reinforcement to the contact areas 255 which increases the ability of the contact areas 255 to withstand wear.

Figure 3:
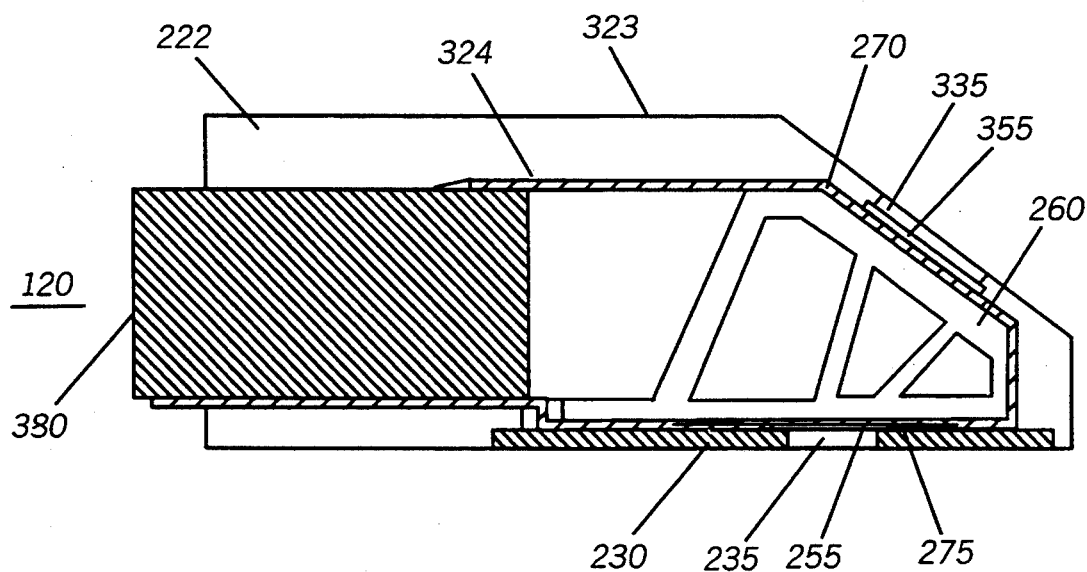
FIG. 3 is a cross-sectional view of the battery of FIG. 2.

Referring to FIG. 3, a cross-sectional view of the battery 120 is shown, according to the present invention. The contact areas 255 are presented through apertures 235 within the housing 222 which enclose and protect the flexible film substrate 270. In the preferred embodiment, the escutcheon 230 is used to add flexibility to handle minor variations in the external presentation of the contact areas 255. For example, various escutcheon designs can be used to determine the shape of the external interface, or to cover an unused contact area, without changing the configuration of the flexible film substrate 270. The escutcheon 230 is positioned over the substrate 270 such that the apertures 235 are positioned over the contact areas 255 which are to be externally accessible. In the preferred embodiment, the flexible circuit substrate 270 has two sets of contact areas 255, 355 distributed along its surface. One set 255 serves to provide an interface between the battery 120 and the radio portion 120 (see FIG. 1), while the other set 355 serves as an interface to the radio charger (not shown). Consequently, there are access apertures 335 which are located in the main housing member 225 to provide access the set of contact areas 355 for the charger.

The housing 222, including the main housing member 225 and the escutcheon 230, has an interior surface 324 and an exterior surface 323. The external access apertures 235, 335 extend through the housing 222 from the exterior surface 323 to the interior surface 324. The substrate 270 is positioned against the portions of the housing 222 about the external access apertures such that the external access apertures 235, 335 expose the contact areas 255, 355 through the housing 222.

The flexible film substrate 270 is electrically connected to a plurality of electrically coupled battery cells 380 within the housing 222. Portions of the substrate about the contact areas 255, 355 are buttressed by the support member 260. The support member 260 engages the substrate 270 about the contact areas 255, 355 to rigidly position the contact areas 255, 355 adjacent to the interior surface 324 of the housing 222. The rigidity afforded by the support member 260 allows the contact areas 255, 355 to withstand the mechanical stresses occurring from repeated engagement by an external device. In the preferred embodiment, the support member 260 is integrally formed into the main housing member, but the support member 260 could also be a separate structure. The support member 260 is shaped to conform to the external shape of the housing member 225, 230 at the location about the access apertures 235, 255. The flexible film substrate 270 is positioned between the support member 260 and the housing member 225, 230 such that the contact areas 255, 355 are aligned with the access apertures 235, 335 on the housing 222. As the flexible film substrate 270 is easily manipulable, it is easily shaped to follow the contours of the external shape of the housing 222, or the shape of the support member 260, thus enhancing its adaptability to various interface presentation designs. For example, an angled interface is formed by angling a portion of the support member 260 about the contact areas 355 adjacent to an angled portion of the housing member 222.

According to the invention, an external contact electrical interface is constructed without the use of discrete contact elements. As is the case with electrical interfaces using discrete contact elements, an external electrical device may engage the contact areas 255, 355 to communicate with the battery 120, or to transfer power between the external device and the battery 120. Benefits inherent with the use of electrical contacts, such as the simplicity and convenience of the interface, can be achieved without the costs associated with the use of discrete electrical contacts. By eliminating the discrete contact elements, there is a corresponding reduction of battery weight. Manufacturing defects related to contact soldering and contact alignment are eliminated. It should be readily apparent that the benefits afforded by the present invention, such as the savings in development and manufacturing costs, as well as a reduction in overall product weight, are extendible to a variety of products.

What is claimed is:

1. A battery pack having an external contact electrical connection for providing an electrical interface to the battery pack, the battery pack comprising:
    a housing member having an interior surface and an exterior surface, and an aperture extending from said exterior surface to said interior surface; and
    a flexible circuit carrying substrate comprising an electrically conductive pattern insulated within insulating flexible film substrate material, wherein a portion of said insulated electrically conductive pattern is exposed through the insulating flexible film substrate material such that the portion is without insulation and such that the portion defines an external interface contact area for the presentation of the electrical interface of the battery pack;
    said contact area being rigidly positioned adjacent to said interior surface about said aperture such that said contact area is externally exposed through said aperture, thereby allowing direct external access to said contact area.

2. A battery pack having an external contact electrical connection for providing an electrical interface to the battery pack as defined in claim 1, further comprising:

a support member engaging said substrate about said contact area to provide substantial support for the positioning of said contact area.

3. A battery pack having an external contact electrical connection for providing an electrical interface to the battery pack as defined in claim 1, wherein said support member is integrally formed with said housing member.

4. A battery pack having an external contact electrical connection for providing an electrical interface to the battery pack as defined in claim 1, wherein said contact area is plated with metal.

5. A battery pack having an external contact electrical connection for providing an electrical interface to the battery pack as defined in claim 1, wherein said housing member comprises:
an escutcheon mounted on said housing over said aperture, said escutcheon having a contact access aperture defined therein.

6. A battery package having an external contact electrical connection for providing an electrical interface to the battery package, the battery package comprising:
a plurality of electrically coupled battery cells;
a housing member enclosing said plurality of battery cells, said housing member having an interior surface and an exterior surface, and an aperture extending from said exterior surface to said interior surface;
a flexible film substrate comprising an electrically conductive pattern embedded within insulating material such that the conductive pattern is generally insulated, said electrically conductive pattern having a portion without insulation, the portion being plated and defining a contact area for the presentation of the electrical interface of the battery package;
said contact area being rigidly positioned adjacent to said interior surface about said aperture such that said contact area is externally exposed through said aperture, thereby allowing direct external access to said contact area.

7. A battery package having an external contact electrical connection for providing an electrical interface to the battery package as defined in claim 6, further comprising:
a support member engaging said substrate about said contact area to provide support for positioning said contact area.

8. A battery package having an external contact electrical connection for providing an electrical interface to the battery package as defined in claim 6, wherein said support member is integrally formed with said housing member.

9. A battery package having an external contact electrical connection for providing an electrical interface to the battery package, the battery package comprising:
a plurality of electrically coupled battery cells;
a housing member enclosing said plurality of battery cells, said housing member having an interior surface and an exterior surface, and an aperture extending from said exterior surface to said interior surface;
a flexible film circuit carrying substrate comprising a metallized pattern insulated within flexible insulating material, said metallized pattern having a portion exposed through the flexible insulating material such that the portion without insulation, the portion being plated to define a contact area for presenting the electrical interface of the device;
a support member engaging said substrate about said contact area, said support member rigidly positioning said contact area adjacent to said interior surface about said aperture such that said contact area is externally exposed through said aperture, thereby allowing direct external access to said contact area.

* * * * *